(12) United States Patent
Fujita et al.

(10) Patent No.: US 9,484,715 B2
(45) Date of Patent: Nov. 1, 2016

(54) QUANTUM-CASCADE LASER

(71) Applicant: HAMAMATSU PHOTONICS K.K., Hamamatsu-shi, Shizuoka (JP)

(72) Inventors: Kazuue Fujita, Hamamatsu (JP); Tadataka Edamura, Hamamatsu (JP); Naota Akikusa, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 0 days.

(21) Appl. No.: 14/888,999

(22) PCT Filed: May 19, 2014

(86) PCT No.: PCT/JP2014/063241
§ 371 (c)(1),
(2) Date: Nov. 4, 2015

(87) PCT Pub. No.: WO2014/189015
PCT Pub. Date: Nov. 27, 2014

(65) Prior Publication Data
US 2016/0087408 A1    Mar. 24, 2016

(30) Foreign Application Priority Data

May 23, 2013  (JP) ................. 2013-109164

(51) Int. Cl.
*H01S 5/34* (2006.01)
*H01S 5/12* (2006.01)
(Continued)

(52) U.S. Cl.
CPC .......... *H01S 5/3402* (2013.01); *H01S 5/0604* (2013.01); *H01S 5/12* (2013.01); *H01S 5/0208* (2013.01); *H01S 5/309* (2013.01); *H01S 2302/02* (2013.01)

(58) Field of Classification Search
CPC ...... H01S 5/3402; H01S 5/0604; H01S 5/12; H01S 5/309; H01S 5/0208; H01S 5/02
See application file for complete search history.

(56) References Cited

U.S. PATENT DOCUMENTS

| 7,974,325 B2* | 7/2011 | Belkin ............. B82Y 20/00 372/45.01 |
| 2009/0213890 A1 | 8/2009 | Patel et al. |
| 2010/0111127 A1* | 5/2010 | Edamura ............. B82Y 20/00 372/45.012 |

FOREIGN PATENT DOCUMENTS

| JP | H08-279647 A | 10/1996 |
| JP | 2008-177366 A | 7/2008 |

(Continued)

OTHER PUBLICATIONS

M. A. Belkin, et al., "Terahertz quantum-cascade-laser source based on intracavity difference-frequency generation," Nature Photonics vol. 1, 2007, pp. 288-292.
(Continued)

*Primary Examiner* — Yuanda Zhang
*Assistant Examiner* — Michael Carter
(74) *Attorney, Agent, or Firm* — Drinker Biddle & Reath LLP

(57) ABSTRACT

A quantum cascade laser is configured with a semiconductor substrate and first and second active layers provided in series on the substrate. A unit laminate structure of the first active layer has a subband level structure having an emission upper level and an emission lower level, and is configured so as to be able to generate light of a first frequency $\omega_1$, a unit laminate structure of the second active layer has a subband level structure having a first emission upper level, a second emission upper level, and a plurality of emission lower levels, and is configured so as to be able to generate light of a second frequency $\omega_2$, and light of a difference frequency $\omega$ is generated by difference frequency generation from the light of the first frequency $\omega_1$ and the light of the second frequency $\omega_2$.

5 Claims, 13 Drawing Sheets

(51) Int. Cl.
    *H01S 5/06* (2006.01)
    *H01S 5/30* (2006.01)
    *H01S 5/02* (2006.01)

(56) References Cited

FOREIGN PATENT DOCUMENTS

| JP | 2010-521815 A | 6/2010 |
|---|---|---|
| JP | 2010-278326 A | 12/2010 |
| JP | 2011-035139 A | 2/2011 |
| JP | 2011-243781 A | 12/2011 |
| WO | WO-2013/061656 A1 | 5/2013 |

OTHER PUBLICATIONS

M. A. Belkin, et al., "Room temperature terahertz quantum cascade laser source based on intracavity difference-frequency generation," Applied Physics Letters vol. 92, 2008, p. 201101-1-p. 201101-3.

Q. Y. Lu, et al., "Widely tuned room temperature terahertz quantum cascade laser sources based on difference-frequency generation," Appl. Phys. Lett. vol. 101, 2012, p. 251121-1-p. 251121-4.

R. Köhler, et al., "Terahertz semiconductor-heterostructure laser," Nature vol. 417, 2002, pp. 156-159.

S. Fathololoumi, et al., "Terahertz quantum cascade lasers operating up to ~ 200 K with optimized oscillator strength and improved injection tunneling," Optics Express Vo. 20, No. 4, 2012, pp. 3866-3876.

Mikhail A. Belkin, et al., "High-Temperature Operation of Terahertz Quantum Cascade Laser Sources," IEEE Journal of Selected Topics in Quantum Electronics, vol. 15, No. 3, 2009, pp. 952-967.

Q. Y. Lu, et al., "Room temperature single-mode terahertz sources based on intracaity difference-frequency generation in quantum cascade lasers," Applied Physics Letters, vol. 99, 2011, p. 131106-1-p. 131106-3.

Karun Vijayraghavan, et al., "Terahertz sources based on Čerenkov difference-frequency generation in quantum cascade lasers," Applied Physics Letters, vol. 100, 2012, p. 251104-1-p. 251104-4.

International Preliminary Report on Patentability dated Dec. 3, 2015 for PCT/JP2014/063241.

* cited by examiner

Fig.6

| SEMICONDUCTOR LAYER | | COMPOSITION | LAYER THICKNESS | DOPING |
|---|---|---|---|---|
| INJECTION BARRIER LAYER 171 | | InAlAs | 3.2nm | undoped |
| EMISSION LAYER 17 | WELL LAYER 161 | InGaAs | 2.1nm | undoped |
| | BARRIER LAYER 172 | InAlAs | 0.8nm | undoped |
| | 162 | InGaAs | 6.8nm | undoped |
| | 173 | InAlAs | 0.7nm | undoped |
| | 163 | InGaAs | 5.8nm | undoped |
| | 174 | InAlAs | 1.2nm | undoped |
| | 164 | InGaAs | 5.3nm | undoped |
| EXIT BARRIER LAYER 191 | | InAlAs | 1.4nm | undoped |
| INJECTION LAYER 18 | WELL LAYER 181 | InGaAs | 4.4nm | undoped |
| | BARRIER LAYER 192 | InAlAs | 1.2nm | undoped |
| | 182 | InGaAs | 4.0nm | undoped |
| | 193 | InAlAs | 1.3nm | undoped |
| | 183 | InGaAs | 3.6nm | undoped |
| | 194 | InAlAs | 1.4nm | Si doped: $2\times10^{17}/cm^3$ |
| | 184 | InGaAs | 3.4nm | Si doped: $2\times10^{17}/cm^3$ |
| | 195 | InAlAs | 1.8nm | Si doped: $2\times10^{17}/cm^3$ |
| | 185 | InGaAs | 3.3nm | Si doped: $2\times10^{17}/cm^3$ |
| | 196 | InAlAs | 2.1nm | undoped |
| | 186 | InGaAs | 3.4nm | undoped |
| | 197 | InAlAs | 2.4nm | undoped |
| | 187 | InGaAs | 3.3nm | undoped |

Fig.8

| SEMICONDUCTOR LAYER | | COMPOSITION | LAYER THICKNESS | DOPING |
|---|---|---|---|---|
| INJECTION BARRIER LAYER 271 | | InAlAs | 3.5nm | undoped |
| EMISSION LAYER 27 | WELL LAYER 261 | InGaAs | 3.3nm | undoped |
| | BARRIER LAYER 272 | InAlAs | 2.3nm | undoped |
| | 262 | InGaAs | 7.7nm | undoped |
| | 273 | InAlAs | 0.7nm | undoped |
| | 263 | InGaAs | 6.0nm | undoped |
| | 274 | InAlAs | 0.9nm | undoped |
| | 264 | InGaAs | 5.4nm | undoped |
| EXIT BARRIER LAYER 291 | | InAlAs | 1.0nm | undoped |
| INJECTION LAYER 28 | WELL LAYER 281 | InGaAs | 4.7nm | undoped |
| | BARRIER LAYER 292 | InAlAs | 0.9nm | undoped |
| | 282 | InGaAs | 4.7nm | undoped |
| | 293 | InAlAs | 1.0nm | undoped |
| | 283 | InGaAs | 4.1nm | undoped |
| | 294 | InAlAs | 1.0nm | Si doped: $2 \times 10^{17}/cm^3$ |
| | 284 | InGaAs | 3.8nm | Si doped: $2 \times 10^{17}/cm^3$ |
| | 295 | InAlAs | 1.8nm | Si doped: $2 \times 10^{17}/cm^3$ |
| | 285 | InGaAs | 3.6nm | Si doped: $2 \times 10^{17}/cm^3$ |
| | 296 | InAlAs | 2.3nm | undoped |
| | 286 | InGaAs | 3.6nm | undoped |
| | 297 | InAlAs | 2.6nm | undoped |
| | 287 | InGaAs | 3.5nm | undoped |

Fig.11
(a)
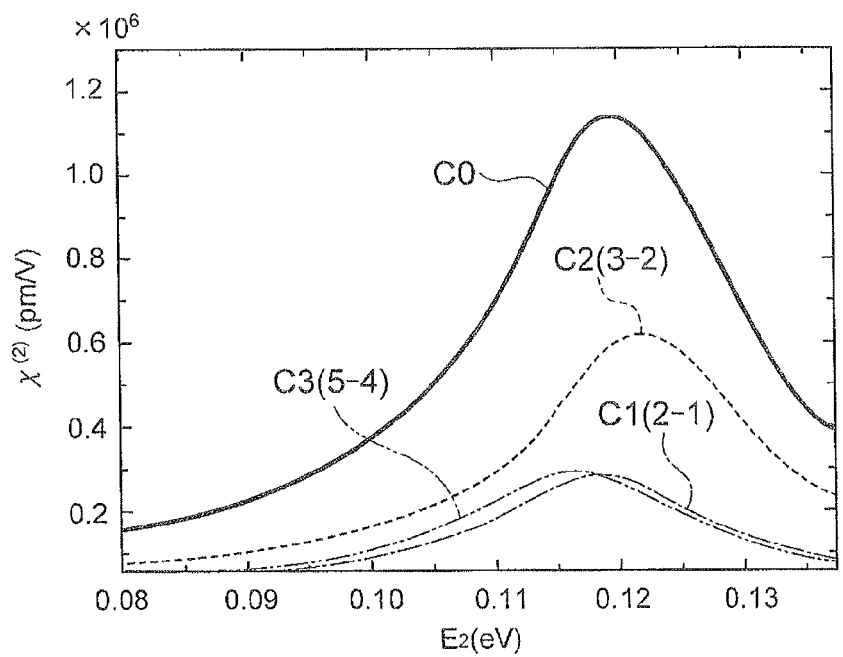
(b)
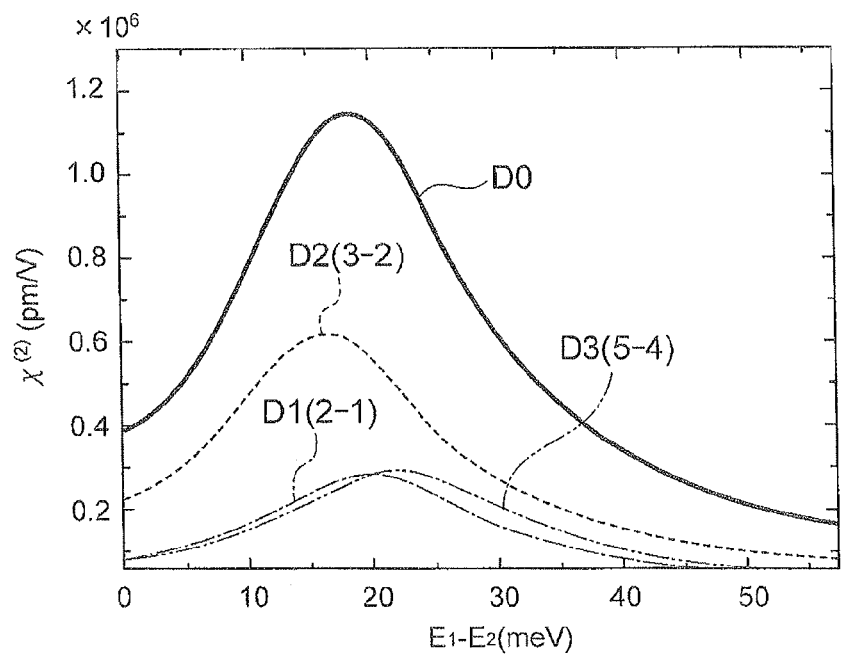

QUANTUM-CASCADE LASER

TECHNICAL FIELD

The present invention relates to a quantum cascade laser using intersubband transitions in a quantum well structure.

BACKGROUND ART

Light in a mid-infrared wavelength range (e.g., wavelengths of 5 to 30 μm) is an important wavelength range in the field of spectrometric analysis. As high-performance semiconductor light sources in this wavelength range, attention has been attracted to quantum cascade lasers (QCL) in recent years (e.g., cf. Patent Literatures 2 to 6, Non Patent Literatures 5 to 7).

A quantum cascade laser is a monopolar type laser element which uses a level structure including subbands formed in a semiconductor quantum well structure, to generate light by transitions of electrons between the subbands, wherein quantum well emission layers, each of which is formed in the quantum well structure and serves as an active region, are cascade-coupled in multiple stages, thereby enabling realization of high-efficiency and high-output operation. This cascade coupling of the quantum well emission layers is realized by use of electron injection layers for injecting electrons into emission upper levels, so as to alternately stack the quantum well emission layers and the injection layers.

CITATION LIST

Patent Literature

Patent Literature 1: Japanese Translation of PCT International Application Publication No. 2010-521815
Patent Literature 2: Japanese Patent Application Laid-Open Publication No. H8-279647
Patent Literature 3: Japanese Patent Application Laid-Open Publication No. 2010-278326
Patent Literature 4: Japanese Patent Application Laid-Open Publication No. 2008-177366
Patent Literature 5: Japanese Patent Application Laid-Open Publication No. 2011-035139
Patent Literature 6: Japanese Patent Application Laid-Open Publication No. 2011-243781

Non Patent Literature

Non Patent Literature 1: M. A. Belkin et al., "Terahertz quantum-cascade-laser source based on intracavity difference-frequency generation," Nature Photonics Vol. 1 (2007) pp. 288-292
Non Patent Literature 2: M. A. Belkin et al., "Room temperature terahertz quantum cascade laser source based on intracavity difference-frequency generation," Appl. Phys. Lett. Vol. 92 (2008) pp. 201101-1-201101-3
Non Patent Literature 3: Q. Y. Lu et al., "Room temperature single-mode terahertz sources based on intracavity difference-frequency generation in quantum cascade lasers," Appl. Phys. Lett. Vol. 99 (2011) 131106-1-131106-3
Non Patent Literature 4: Q. Y. Lu et al., "Widely tuned room temperature terahertz quantum cascade laser sources based on difference-frequency generation," Appl. Phys. Lett. Vol. 101 (2012) pp. 251121-1-251121-4
Non Patent Literature 5: R. Kohler et al., "Terahertz semiconductor-heterostructure laser," NATURE Vol. 417 (2002) pp. 156-159
Non Patent Literature 6: S. Fathololoumi et al., "Terahertz quantum cascade lasers operating up to ~200 K with optimized oscillator strength and improved injection tunneling," Optics Express Vol. 20 (2012) pp. 3866-3876
Non Patent Literature 7: K. Vijayraghavan et al., "Terahertz sources based on Cerenkov difference-frequency generation in quantum cascade lasers," Appl. Phys. Lett. Vol. 100 (2012) pp. 251104-1-251104-4

SUMMARY OF INVENTION

Technical Problem

The quantum cascade laser was first successfully lased in 1994 and since then, the lasing wavelength thereof has been actively increased toward longer wavelengths; in 2002, R. Kohler et al reported the lasing in the terahertz (THz) band (Non Patent Literature 5: NATURE Vol. 417 (2002) pp. 156-159). The terahertz band is a so-called far-infrared region of about 100 μm in terms of wavelength, which is a range corresponding to the boundary between radio waves and light. Since the terahertz light (terahertz wave) has the feature of possessing both of the transmitting property of radio wave and the rectilinearity of light, application thereof as unprecedented sensing means is under research in various fields including the medical biology, security, communication, cosmic observation, and so on.

It was hard for the semiconductor lasers of conventional structures to realize the increase in wavelength up to the terahertz band, but the quantum cascade lasers have realized the lasing in the terahertz band as described above. However, it is the present status that the laser operation is still limited to an extremely-low temperature environment using liquid nitrogen, and there are problems in effectiveness to industrial application.

For example, S. Fathololoumi et al. (Non Patent Literature 6: Optics Express Vol. 20 (2012) pp. 3866-3876) reported the maximum operating temperature of ~200K at the oscillation frequency of 2.85 THz in the configuration wherein the active layer is configured by cascade coupling of triple quantum well structures of $GaAs/Al_xGa_{1-x}As$ (x=0.15). However, the status quo method is in a situation where it is very difficult to achieve higher-temperature operation.

On the other hand, M. A. Belkin et al. have succeeded in generating the terahertz light (THz light) by difference frequency generation (DFG) through the use of two-wavelength oscillation type mid-infrared QCL and the second order nonlinear optical effect in the QCL (Patent Literature 1: Japanese Translation of PCT International Application Publication No. 2010-521815, Non Patent Literature 1: Nature Photonics Vol. 1 (2007) pp. 288-292, Non Patent Literature 2: Appl. Phys. Lett. Vol. 92 (2008) pp. 201101-1-201101-3). It was already confirmed that the QCL of this configuration (DFG-THz-QCL) was able to operate at room temperature, and further improvement in characteristics is expected.

Further, recently, a group in Northwestern University also reported similar DFG-THz-QCL (Non Patent Literature 3: Appl. Phys. Lett. Vol. 99 (2011) 131106-1-131106-3, Non Patent Literature 4: Appl. Phys, Lett, Vol. 101 (2012) pp. 251121-1-251121-4). However, the present DFG-THz-QCL has the light output at a level of several ten μW at room temperature and requires large power consumption; therefore, it is also difficult for it to lase at a high duty cycle. Accordingly, the QCL of this type is also required to achieve further improvement in characteristics.

The present invention has been made in order to solve the above problem, and an object thereof is to provide a quantum cascade laser capable of suitably generating long-wavelength light such as the above-described terahertz light.

Solution to Problem

In order to achieve the above object, a quantum cascade laser according to the present invention comprises: (1) a semiconductor substrate; (2) a first active layer provided on the semiconductor substrate and having a cascade structure in which quantum well emission layers and injection layers are alternately stacked in the form of a multistage lamination of first unit laminate structures each of which comprises the quantum well emission layer and the injection layer; and (3) a second active layer provided in series to the first active layer on the semiconductor substrate and having a cascade structure in which quantum well emission layers and injection layers are alternately stacked in the form of a multistage lamination of second unit laminate structures each of which comprises the quantum well emission layer and the injection layer, wherein (4) the first unit laminate structure of the first active layer has a subband level structure having an emission upper level and an emission lower level, and is configured so as to be able to generate light of a first frequency $\omega_1$ by intersubband emission transition of electrons, (5) the second unit laminate structure of the second active layer has a subband level structure having a first emission upper level, a second emission upper level of a higher energy than the first emission upper level, and a plurality of emission lower levels, and is configured so as to be able to generate at least light of a second frequency $\omega_2$ by intersubband emission transitions of electrons, and (6) light of a difference frequency $\omega$ between the first frequency $\omega_1$ and the second frequency $\omega_2$ is generated by difference frequency generation from the light of the first frequency $\omega_1$ generated in the first active layer and the light of the second frequency $\omega_2$ generated in the second active layer.

The foregoing quantum cascade laser has the configuration in which the two types of active layers, the first active layer with the first unit laminate structures and configured to generate the light of the first frequency (angular frequency, which will be referred to hereinafter simply as frequency) $\omega_1$ and the second active layer with the second unit laminate structures and configured to generate the light of the second frequency $\omega_2$, are provided in series on the semiconductor substrate. In this configuration, long-wavelength light, e.g., such as the terahertz light can be generated as light of the difference frequency $\omega=|\omega_1-\omega_2|$, by making use of the difference frequency generation by the light of the first frequency $\omega_1$ and the light of the second frequency $\omega_2$.

In the foregoing configuration, the second unit laminate structure forming the second active layer, out of the first and second active layers, is configured with the subband level structure having the first and second emission upper levels and the plurality of emission lower levels. By this DAU/MS (dual-upper-state to multiple lower state) structure, the value of the second order nonlinear susceptibility $\chi^{(2)}$ necessary for the difference frequency generation can be made larger by properly setting the level distances between the levels in the level structure associated with the emission of light. This enables the long-wavelength light such as terahertz light to be suitably generated with high efficiency by the difference frequency generation.

Advantageous Effects of Invention

In the quantum cascade laser of the present invention, the first active layer including the first unit laminate structures and configured to generate the light of the first frequency $\omega_1$ and the second active layer including the second unit laminate structures and configured to generate the light of the second frequency $\omega_2$ are provided in series on the semiconductor substrate, the light of the difference frequency $\omega$ is generated by the difference frequency generation from the light of the first frequency $\omega_1$ and the light of the second frequency $\omega_2$, and the second unit laminate structure forming the second active layer is configured with the subband level structure having the first and second emission upper levels and the plurality of emission lower levels, whereby the long-wavelength light such as the terahertz light can be suitably generated with high efficiency.

BRIEF DESCRIPTION OF DRAWINGS

FIG. 6 is a table showing an example of a structure of the unit laminate structure of one period in the first active layer.

FIG. 8 is a table showing an example of a structure of the unit laminate structure of one period in the second active layer.

FIG. 11 includes (a), (b) graphs showing dependence of the second order nonlinear susceptibility on energy of light of the second frequency $\omega_2$.

DESCRIPTION OF EMBODIMENTS

Figure 1:
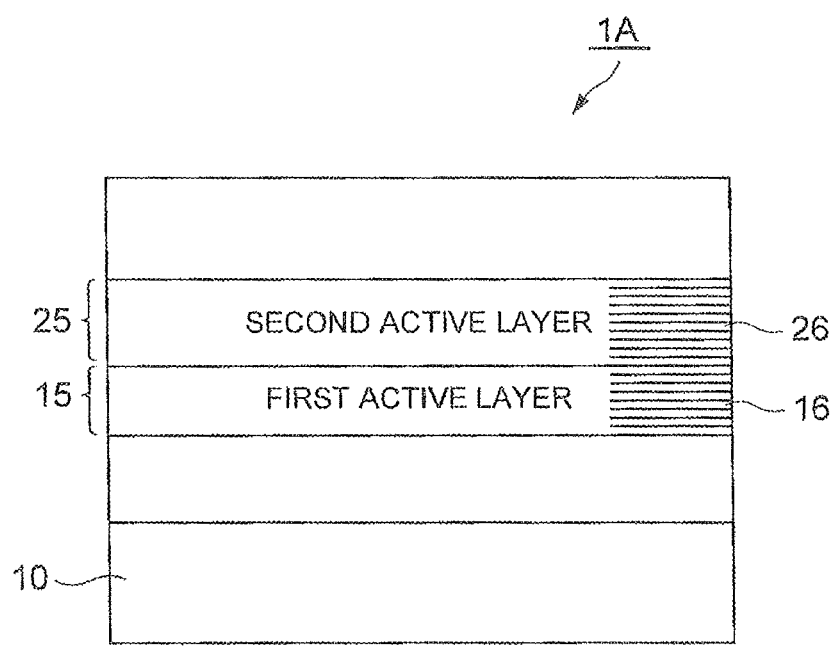
FIG. 1 is a drawing schematically showing a basic configuration of a quantum cascade laser.

An embodiment of the quantum cascade laser according to the present invention will be described below in detail with reference to the drawings. In the description of the drawings, the same elements will be denoted by the same reference signs, without redundant description. It should be noted that the dimensional ratios in the drawings are not always coincident with those in the description.

FIG. 1 is a drawing schematically showing the basic configuration of the quantum cascade laser according to the present invention. The quantum cascade laser 1A of the present embodiment is a monopolar type laser device that generates light by using electron transitions between subbands in the semiconductor quantum well structure. This quantum cascade laser 1A has a semiconductor substrate 10, a first active layer 15 formed on the semiconductor substrate 10, and a second active layer 25 formed in series to the first active layer 15 on the semiconductor substrate 10, and is configured to generate light of a difference frequency $\omega = |\omega_1 - \omega_2|$ between a first frequency $\omega_1$ and a second frequency $\omega_2$, by the difference frequency generation (DFG) from light of the first frequency $\omega_1$ generated in the first active layer 15 and light of the second frequency $\omega_2$ generated in the second active layer 25. The light of the frequency $\omega$ generated herein is long-wavelength light such as the terahertz light, for example.

The first active layer 15 has a cascade structure in which quantum well emission layers to be used for generation of light and electron injection layers to be used for injection of electrons into the emission layers are stacked alternately in multiple stages. Specifically, when a first unit laminate structure 16 of one period is defined as a semiconductor laminate structure consisting of a quantum well emission layer and an injection layer, the first active layer 15 having the cascade structure is configured by stacking the first unit laminate structures 16 in multiple stages. The number of first unit laminate structures 16 stacked is set according to circumstances, and is, for example, about several hundred.

The second active layer 25 has a cascade structure in which quantum well emission layers to be used for generation of light and electron injection layers to be used for injection of electrons into the emission layers are stacked alternately in multiple stages, as the active layer 15 does. Specifically, when a second unit laminate structure 26 of one period is defined as a semiconductor laminate structure consisting of a quantum well emission layer and an injection layer, which is different from the first unit laminate structure 16, the second active layer 25 having the cascade structure is configured by stacking the second unit laminate structures 26 in multiple stages. The number of second unit laminate structures 26 stacked is set according to circumstances, and is, for example, about several hundred.

In this configuration, the first active layer 15 is formed directly or through another semiconductor layer on the semiconductor substrate 10. In the configuration example shown in FIG. 1, the second active layer 25 is formed directly on the first active layer 15. It is noted, as to this second active layer 25, that, for example, another semiconductor layer (e.g., a buffer layer) may be located between the first active layer 15 and the second active layer 25. The stacking order of the first and second active layers 15, 25 from the semiconductor substrate 10 side may be reverse. The below will describe a configuration example of level structures in the first and second active layers 15, 25.

Figure 2:
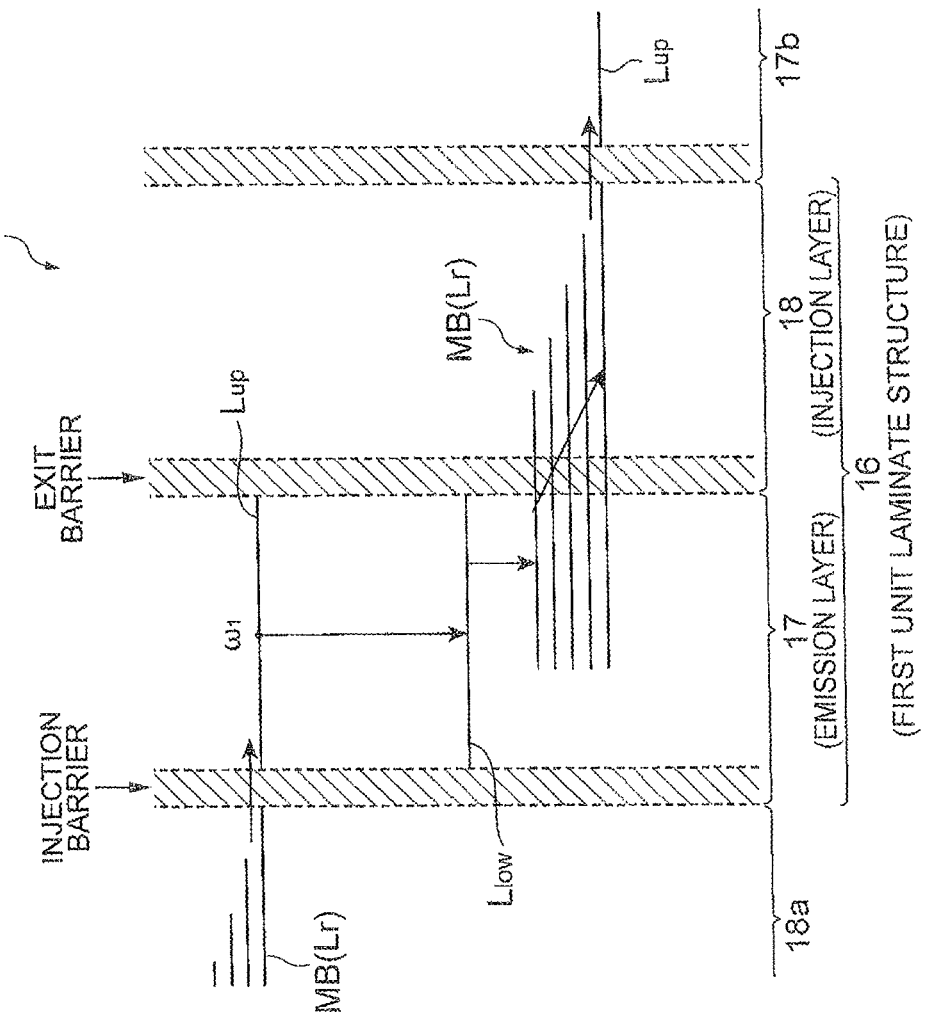
FIG. 2 is a drawing showing a subband level structure in a first active layer of the quantum cascade laser.

FIG. 2 is a drawing showing the subband level structure in the first active layer of the quantum cascade laser shown in FIG. 1. The first active layer 15 in the present embodiment has the SPC (single phonon resonance-continuum) structure (cf. Patent Literature 4: Japanese Patent Application Laid-open Publication No. 2008-177366) and is configured so as to be able to generate the light of the first frequency $\omega_1$.

As shown in FIG. 2, each of the plurality of unit laminate structures 16 included in the first active layer 15 consists of a quantum well emission layer 17 and an electron injection layer 18. Each of these emission layer 17 and injection layer 18 is formed with a predetermined quantum well structure including quantum well layers and quantum barrier layers.

In this configuration, the subband level structure, which is an energy level structure based on the quantum well structure, is formed in the first unit laminate structure 16.

The first unit laminate structure 16 in the present embodiment, as shown in FIG. 2, has the subband level structure having an emission upper level $L_{up}$, an emission lower level $L_{low}$, and a relaxation miniband MB including a plurality of levels of lower energies than the emission lower level $L_{low}$ and functioning as relaxation level $L_r$. The relaxation miniband MB is set so that an energy difference between the emission lower level $L_{low}$ and the miniband MB becomes equal to the energy of a longitudinal optical (LO) phonon.

In the unit laminate structure 16 shown in FIG. 2, an injection barrier layer for electrons to be injected from the injection layer 18a into the emission layer 17 is provided between the emission layer 17 and the injection layer 18a in the unit laminate structure of the preceding stage. Furthermore, an exit barrier layer for electrons from the emission layer 17 to the injection layer 18 is provided between the emission layer 17 and the injection layer 18. These barrier layers are provided as needed, depending upon the specific lamination structure and subband level structure of the first active layer 15 including the emission layers 17 and injection layers 18.

In this subband level structure, electrons from the relaxation miniband MB in the injection layer 18a of the preceding stage are injected through the injection barrier into the emission upper level $L_{up}$ in the emission layer 17. The electrons injected into the emission upper level $L_{up}$ transit with emission of light to the emission lower level $L_{low}$, resulting in generating and emitting the light of the first frequency $\omega_1$ with an energy $E_1$ corresponding to an energy difference between the subband levels of the upper level and lower level.

The electrons having transited to the emission lower level $L_{low}$ are quickly relaxed to the relaxation miniband MB by LO phonon scattering and further quickly relaxed in the miniband MB. As electrons are quickly extracted through the LO phonon scattering and relaxation in the miniband from the emission lower level $L_{low}$ in this manner, a population inversion is made enough to achieve lasing between the upper level $L_{up}$ and the lower level $L_{low}$.

The relaxation miniband MB is preferably formed with a band structure in which a miniband in the emission layer 17 is coupled to a miniband in the injection layer 18, as shown in FIG. 2. In this configuration, the electrons relaxed from the emission lower level $L_{low}$ into the miniband MB are injected in a cascade manner from the relaxation miniband MB through the exit barrier and injection layer 18 into the emission upper level $L_{up}$ in the emission layer 17b of the subsequent stage.

As the injection, emission transition, and relaxation of electrons as described above are repeated in the plurality of unit laminate structures 16 constituting the first active layer 15, light generation occurs in a cascade manner in the active layer 15. Namely, the emission layers 17 and the injection layers 18 are stacked alternately in a large number of stages, whereby electrons sequentially move in a cascade manner in the laminate structures 16 while the light of the first frequency $\omega_1$ is generated during the intersubband emission transition in each laminate structure 16.

Figure 3:
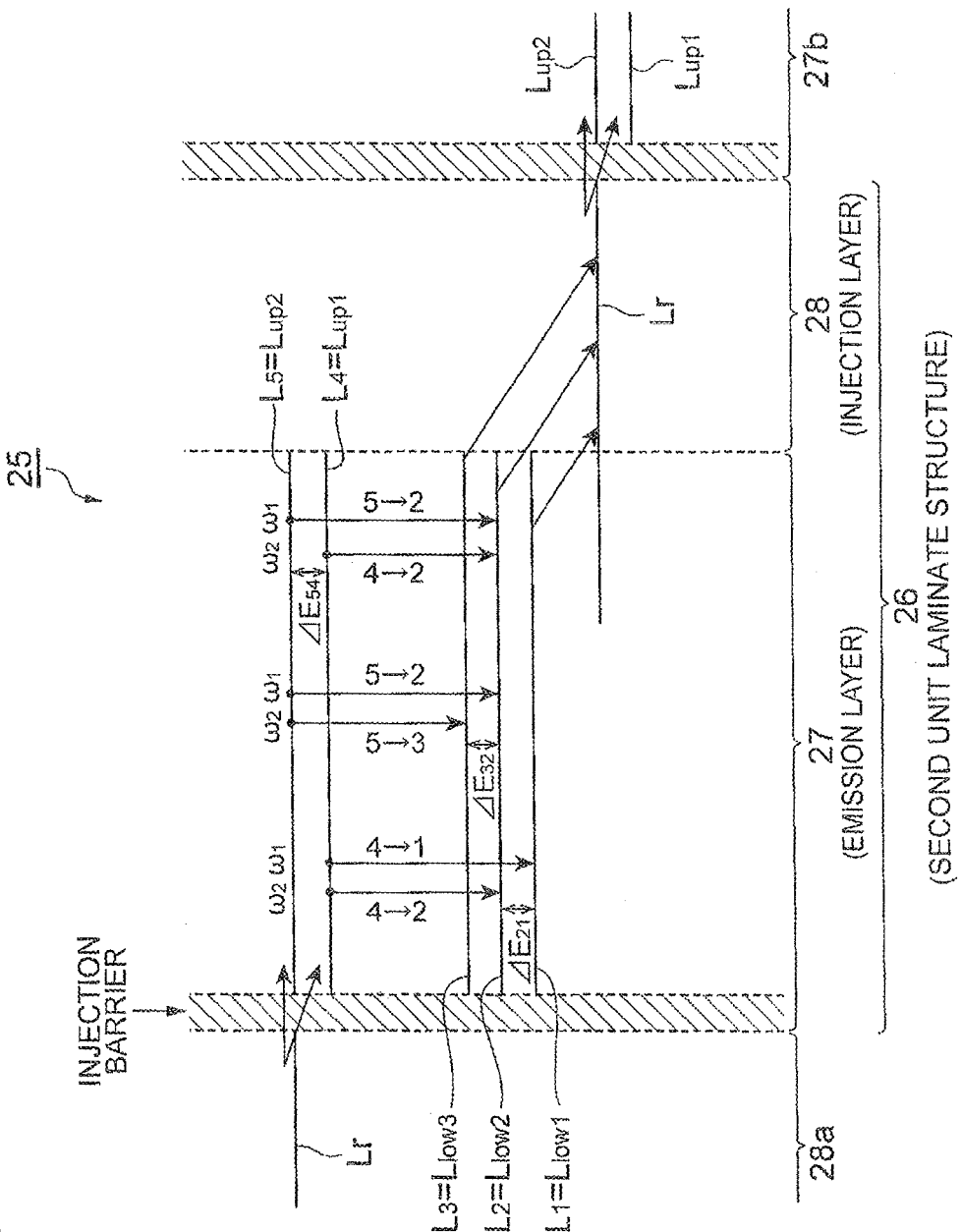
FIG. 3 is a drawing showing a subband level structure in a second active layer of the quantum cascade laser.

FIG. 3 is a drawing showing the subband level structure in the second active layer of the quantum cascade laser shown in FIG. 1. The second active layer 25 in the present embodiment has the DAU/MS (dual-upper-state to multiple lower state) structure (cf. Patent Literature 5: Japanese Patent Application Laid-open Publication No. 2011-035139, Patent Literature 6: Japanese Patent Application Laid-open Publication No. 2011-243781) and is configured so as to be able to generate the light of the first frequency $\omega_1$ and the light of the second frequency $\omega_2$.

As shown in FIG. 3, each of the plurality of unit laminate structures 26 included in the second active layer 25 consists of a quantum well emission layer 27 and an electron injection layer 28. Each of these emission layer 27 and injection layer 28 is formed with a predetermined quantum well structure including quantum well layers and quantum barrier layers. In this configuration, the subband level structure, which is an energy level structure based on the quantum well structure, is formed in the second unit laminate structure 26.

The second unit laminate structure 26 in the present embodiment, as shown in FIG. 3, has the subband level structure having a first emission upper level (level 4) $L_{up1}=L_4$, a second emission upper level (level 5) $L_{up2}=L_5$ of a higher energy than the first emission upper level, a plurality of emission lower levels, and a relaxation level $L_r$ of a lower energy than the emission lower levels. In the foregoing level structure, more specifically, the second unit laminate structure 26 has, as the plurality of emission lower levels, a first emission lower level (level 1) $L_{low1}=L_1$, a second emission lower level (level 2) $L_{low2}=L_2$ of a higher energy than the first emission lower level, and a third emission lower level (level 3) $L_{low3}=L_3$ of a higher energy than the second emission lower level.

In the unit laminate structure 26 shown in FIG. 3, an injection barrier layer for electrons to be injected from the injection layer 28a into the emission layer 27 is provided between the emission layer 27 and the injection layer 28a in the unit laminate structure of the preceding stage. Furthermore, an exit barrier layer for electrons from the emission layer 27 to the injection layer 28 is also provided as needed, between the emission layer 27 and the injection layer 28. However, FIG. 3 shows the configuration example in which only a barrier layer thin enough for the wave function to fully exude is provided between the emission layer 27 and the injection layer 28.

A specific spacing configuration of the levels in the subband level structure in the second unit laminate structure 26 is as follows: each of an energy $\Delta E_{41}$ of an emission transition (4→1) from the first emission upper level $L_{up1}$ to the first emission lower level $L_{low1}$ and an energy $\Delta E_{52}$ of an emission transition (5→2) from the second emission upper level $L_{up2}$ to the second emission lower level $L_{low2}$ is substantially equal to an energy $E_1$ of the light of the first frequency $\omega_1$ ($\Delta E_{41}=\Delta E_{52}=E_1$). Furthermore, each of an energy $\Delta E_{42}$ of an emission transition (4→2) from the first emission upper level $L_{up1}$ to the second emission lower level $L_{low2}$ and an energy $\Delta E_{53}$ of an emission transition (5→3) from the second emission upper level $L_{up2}$ to the third emission lower level $L_{low3}$ is substantially equal to an energy $E_2$ of the light of the second frequency $\omega_2$ ($\Delta E_{42}=\Delta E_{53}=E_2$). In the present configuration example, the first and second frequencies $\omega_1$, $\omega_2$ are set so as to satisfy the condition of $\omega_1>\omega_2$, and the difference frequency is $\omega=\omega_1-\omega_2$.

In the foregoing subband level structure, each of an energy difference $\Delta E_{21}$ between the first emission lower level $L_{low1}$ and the second emission lower level $L_{low2}$, an energy difference $\Delta E_{32}$ between the second emission lower level $L_{low2}$ and the third emission lower level $L_{low3}$, and an energy difference $\Delta E_{54}$ between the first emission upper level $L_{up1}$ and the second emission upper level $L_{up2}$ is substantially equal to an energy $E=E_1-E_2$ of the light of the difference frequency $\omega$ of the first and second frequencies $\omega_1$, $\omega_2$ ($\Delta E_{21}=\Delta E_{32}=\Delta E_{54}=E$).

In this subband level structure, electrons from the relaxation level $L_r$ in the injection layer 28a of the preceding stage are injected through the injection barrier into the emission layer 27, to strongly excite the second emission upper level $L_{up2}$ coupled to the relaxation level $L_r$. At this time, a sufficient amount of electrons are also supplied to the first emission upper level $L_{up1}$ through a high-speed scattering process such as electron-electron scattering, with the result that sufficient amounts of carriers are supplied to both of the two emission upper levels $L_{up1}$, $L_{up2}$.

The electrons injected into the first and second emission upper levels $L_{up1}$, $L_{up2}$ transit respectively to the first, second, and third emission lower levels $L_{low1}$, $L_{low2}$, and $L_{low3}$, so as to generate and emit light with energies corresponding to the energy differences between the subband levels of the emission upper levels and lower levels; particularly, it results in generating and emitting the light of the first frequency $\omega_1$ with the energy $E_1$ and the light of the second frequency $\omega_2$ with the energy $E_2$.

The electrons having transited to the emission lower levels $L_{low1}$, $L_{low2}$, and $L_{low3}$ are relaxed to the relaxation level $L_r$. As the electrons are extracted from the emission lower levels $L_{low1}$, $L_{low2}$, and $L_{low3}$ in this manner, a population inversion is made enough to achieve lasing between the upper levels $L_{up1}$, $L_{up2}$ and the lower levels $L_{low1}$, $L_{low2}$, $L_{low3}$. Here, in this example, the relaxation level $L_r$ used for relaxation of electrons is schematically represented by only one level in FIG. 3, but the relaxation level may be configured by a plurality of levels, or by a miniband. The electrons relaxed from the emission lower levels to the relaxation level $L_r$ are injected in a cascade manner from the relaxation level $L_r$ through the injection layer 28 into the emission upper levels $L_{up1}$, $L_{up2}$ in the emission layer 27b of the subsequent stage.

As the injection, emission transitions, and relaxation of electrons as described above are repeated in the plurality of unit laminate structures 26 constituting the second active layer 25, light generation occurs in a cascade manner in the active layer 25. Namely, the emission layers 27 and the injection layers 28 are stacked alternately in a large number of stages, whereby electrons sequentially move in a cascade manner in the laminate structures 26 while generating the light of the first frequency $\omega_1$ and the light of the second frequency $\omega_2$ during the intersubband emission transitions in each laminate structure 26.

In the second active layer 25 shown in FIG. 3, as detailed later, the second order nonlinear susceptibility $\chi^{(2)}$ necessary for the difference frequency generation from the light, of the first and second frequencies $\omega_1$, $\omega_2$ is made larger by the foregoing level structure in the second unit laminate structures 26 constituting the active layer 25. This causes the laser 1A with the stack of the first and second active layers 15, 25 to generate the light of the difference frequency $\omega$ such as the THz light, by the difference frequency generation from the light of the first frequency $\omega_1$ generated in the first active layer 15 and the light of the first, second frequencies $\omega_1$, $\omega_2$ generated in the second active layer 25.

Further, it is also possible to adopt a configuration in which the semiconductor laminate structure in the quantum cascade laser 1A shown in FIG. 1 is provided with a distributed feedback type oscillation mechanism by a diffraction grating for selectively oscillating the light of the second frequency $\omega_2$, for the light generated in the second active layer 25. In this case, the light of the difference frequency $\omega$ is generated by the difference frequency generation from the light of the first frequency $\omega_1$ generated in the first active layer 15 and the light of the second frequency $\omega_2$ generated in the second active layer 25 and selected by the diffraction grating structure.

Effects of the quantum cascade laser 1A of the present embodiment will be described below.

The quantum cascade laser 1A shown in FIG. 1 to FIG. 3 has the configuration wherein the two types of active layers, the first active layer 15 constituted by the first unit laminate structures 16 and configured to generate the light of the first frequency $\omega_1$ and the second active layer 25 constituted by the second unit laminate structures 26 and configured to generate at least the light of the second frequency $\omega_2$, are provided in series on the semiconductor substrate 10. In this configuration, long-wavelength light, e.g., such as the terahertz light can be generated as the light of the difference frequency $\omega$, by making use of the difference frequency generation by the light of the first frequency $\omega_1$ and the light of the second frequency $\omega_2$.

In the above configuration, the second unit laminate structure 26 forming the second active layer 25, out of the first and second active layers 15, 25, is configured with the subband level structure having the first and second emission upper levels $L_{up1}$, $L_{up2}$ and the plurality of emission lower levels (the first to third emission lower levels $L_{low1}$, $L_{low2}$, and $L_{low3}$ in the configuration of FIG. 3). By this DAU/MS structure, the value of the second order nonlinear susceptibility $\chi^{(2)}$ necessary for the difference frequency generation from the light of the first frequency $\omega_1$ and the light of the second frequency $\omega_2$ can be made larger by properly setting the level distances of the respective levels in the level structure associated with the emission of light. This allows the long-wavelength light such as the terahertz light to be suitably generated with high efficiency by the difference frequency generation.

In the above configuration, the second unit laminate structure 26 of the second active layer 25 is preferably configured so as to be able to generate the light of the first frequency $\omega_1$, in addition to the light of the second frequency $\omega_2$, in its subband level structure. This configuration makes the second order nonlinear susceptibility $\chi^{(2)}$ for the difference frequency generation from the light of the first frequency $\omega_1$ and the light of the second frequency $\omega_2$ sufficiently large enough to enable high-efficiency generation of the light of the difference frequency $\omega$.

Further, the laser is preferably provided with a mechanism for selecting the light of the second frequency $\omega_2$ from the light generated in the second active layer 25, e.g., the distributed feedback type oscillation mechanism by the diffraction grating. When the quantum cascade laser 1A is provided with such a distributed feedback (DFB) type oscillation mechanism in the cavity structure, the light of the second frequency $\omega_2$ used for generation of the light of the difference frequency $\omega$ can be suitably and selectively generated in the second active layer 25 having the DAU/MS structure. This DFB type oscillation mechanism does not always have to be provided if there is no need for selectively generating the light of the second frequency $\omega_2$ in the second active layer 25.

The level structure, associated with the light emission and difference frequency generation in the second active layer 25 may be configured more specifically in such a configuration that, as shown in FIG. 3, the second unit laminate structure 26 of the second active layer 25 has the subband level structure having the first emission lower level $L_{low1}$, the second emission lower level $L_{low2}$ of the higher energy than the first emission lower level, and the third emission lower level $L_{low3}$ of the higher energy than the second emission lower level, as the plurality of emission lower levels.

In this case, the second unit laminate structure 26 of the second active layer 25 is preferably configured so that each of the energy difference $\Delta E_{21}$ between the first emission lower level and the second emission lower level, the energy difference $\Delta E_{32}$ between the second emission lower level and the third emission lower level, and the energy difference $\Delta E_{54}$ between the first emission upper level and the second emission upper level is substantially equal to the energy E of the light of the difference frequency $\omega$. The configuration for making the energy differences of the three level distances approximately equal can make the second order nonlinear susceptibility $\chi^{(2)}$ for generating the light of the difference frequency $\omega$ by the difference frequency generation sufficiently large enough to improve the efficiency of the difference frequency generation.

In this case, as to the energies of the emission transitions between the subbands, the second unit laminate structure 26 of the second active layer 25 is preferably configured with the subband level structure such that each of the energy $\Delta E_{41}$ of the emission transition from the first emission upper level to the first emission lower level and the energy $\Delta E_{52}$ of the emission transition from the second emission upper level to the second emission lower level is substantially equal to the energy of the light of one of the first frequency $\omega_1$ and the second frequency $\omega_2$ (the light of the first frequency $\omega_1$ in FIG. 3), and such that each of the energy $\Delta E_{42}$ of the emission transition from the first emission upper level to the second emission lower level and the energy $\Delta E_{53}$ of the emission transition from the second emission upper level to the third emission lower level is substantially equal to the energy of the light of the other of the first frequency $\omega_1$ and the second frequency $\omega_2$ (the light of the second frequency $\omega_2$ in FIG. 3). This configuration can suitably realize both of the supply of the light of the second frequency $\omega_2$ and the generation of the light of the difference frequency $\omega$ by DFG in the second active layer 25.

The plurality of emission lower levels in the second unit laminate structure 26 of the second active layer 25 do not have to be limited to the configuration having the three emission lower levels as described above, but it is also possible to adopt a configuration having two, or four or more emission lower levels, for the first and second emission upper levels. Such a configuration can also improve the efficiency of the difference frequency generation, by making each of energy differences between adjacent emission lower levels substantially equal to the energy of the light of the difference frequency $\omega$.

In the above configuration, the level structure in the first active layer 15 to supply the light of the first frequency $\omega_1$ can be configured as follows: the first unit laminate structure 16 of the first active layer 15 has the subband level structure having the relaxation miniband MB including the plurality of levels of lower energies than the emission lower level $L_{low}$, as shown in FIG. 2, and the electrons through the emission transition from the emission upper level to the emission lower level are relaxed from the emission lower level to the relaxation miniband by LO phonon scattering. This SPC structure can suitably generate the light of the first frequency $\omega_1$ with high efficiency. It is noted that the subband level structure in the first active layer 15 may be selected from a variety of level structures, without having to be limited to the aforementioned SPC structure, as long as they can suitably generate the light of the first frequency $\omega_1$.

The generation of the terahertz (THz) light by making use of the difference frequency generation (DFG) in the quantum cascade laser 1A of the above-described embodiment will be further described. DFG-THz-QCL necessitates, for realizing the generation of the THz wave by using the DFG, the pump light components having two different frequencies $\omega_1$, $\omega_2$ (for example, mid-infrared light components), and the active layer having the high second order nonlinear susceptibility $\chi^{(2)}$ for those pump light components. The quantum cascade laser 1A shown in FIG. 1 to FIG. 3 realizes the above condition by combining the first active layer 15 for generating the light of the first frequency $\omega_1$ with the second active layer 25 for generating the light of the second frequency $\omega_2$, and by adopting the DAU/MS structure in the second active layer 25.

The DAU/MS structure, the specific example of the configuration of which is shown in FIG. 3, is the level structure that can obtain an extremely wide gain curve by making use of the intersubband transitions from the first and second emission upper levels to the plurality of emission lower levels, and that can also obtain good laser characteristics by formation of the population inversion at high efficiency. When this DAU/MS structure is configured by properly designing the level numbers of the upper levels and lower levels, the energies of the respective levels, the energy intervals between the levels, and others, it can realize the large second order nonlinear susceptibility $\chi^{(2)}$ more than double of those in the conventional examples, and the high-efficiency DFG based thereon.

Namely, as represented by Formula (1) to Formula (4) below, the power $W(\omega)$ of the light of the difference frequency $\omega$ generated by the DFG is proportional to the powers $W(\omega_1)$, $W(\omega_2)$ of the mid-infrared pump light components of the first and second frequencies and to the square of the coherence length $l_{coh}$, and the nonlinear susceptibility $\chi^{(2)}$ is proportional to the dipole moments $z_{nm}$ of transitions.

[Math 1]
$$W(\omega = \omega_1 - \omega_2) \propto |\chi^{(2)}|^2 \times W(\omega_1) W(\omega_2) \times l_{coh}^2 \quad (1)$$

[Math 2]
$$\chi^{(2)} \approx \frac{e^3 N_e}{\hbar^2 \varepsilon_0} \frac{z_{42} z_{21} z_{41}}{(\omega - \omega_{21} + i\Gamma_{21})} \times \left( \frac{1}{\omega_1 + \omega_{41} + i\Gamma_{41}} + \frac{1}{-\omega_2 - \omega_{42} + i\Gamma_{42}} \right) \quad (2)$$

[Math 3]
$$\chi^{(2)} \approx \frac{e^3 N_e}{\hbar^2 \varepsilon_0} \frac{z_{53} z_{32} z_{52}}{(\omega - \omega_{32} + i\Gamma_{32})} \times \left( \frac{1}{\omega_1 + \omega_{52} + i\Gamma_{52}} + \frac{1}{-\omega_2 - \omega_{53} + i\Gamma_{53}} \right) \quad (3)$$

[Math 4]
$$\chi^{(2)} \approx \frac{e^3 N_e}{\hbar^2 \varepsilon_0} \frac{z_{42} z_{54} z_{52}}{(\omega - \omega_{54} + i\Gamma_{54})} \times \left( \frac{1}{\omega_1 + \omega_{52} + i\Gamma_{52}} + \frac{1}{-\omega_2 - \omega_{42} + i\Gamma_{42}} \right) \quad (4)$$

In the above formulas, e represents electric charge, Ne the population inversion number, and $\Gamma_{nm}$ the emission half width. Formula (2) expresses $\chi^{(2)}$ for the difference frequency $\omega$ generated for $\Delta E_{21}$, Formula (3) expresses $\chi^{(2)}$ for the difference frequency $\omega$ generated for $\Delta E_{32}$, and Formula (4) expresses $\chi^{(2)}$ for the difference frequency $\omega$ generated for $\Delta E_{54}$. As represented by Formula (2) to Formula (4), the second order nonlinear susceptibility $\chi^{(2)}$ is expressed by the sum of the products of dipole moments in corresponding transitions.

Here, the subband level structure of the second active layer 25 shown in FIG. 3 generates the light, based on the transitions of the electrons injected into the upper levels $L_4$, $L_5$, to the lower levels $L_1$, $L_2$, and $L_3$. In this configuration, as described above about FIG. 3, the emission transitions 4→1, 5→2 can be the transitions of the same first frequency $\omega_1$ and the emission transitions 4→2, 5→3 can be the transitions of the same second frequency $\omega_2$. Further, at this time, the difference frequency $\omega$ between the frequencies $\omega_1$ and $\omega_2$ corresponds to the frequency of THz light as an object to be generated, the three level distances of $\Delta E_{54}$, $\Delta E_{32}$, and $\Delta E_{21}$ shown in FIG. 3 are equal, and these level distances contribute to the second order nonlinear susceptibility $\chi^{(2)}$. Therefore, the configuration of the above embodiment can realize the large susceptibility $\chi^{(2)}$ more than double of that in the conventional structure in which only about one level distance contributes to the susceptibility $\chi^{(2)}$.

Figure 4:
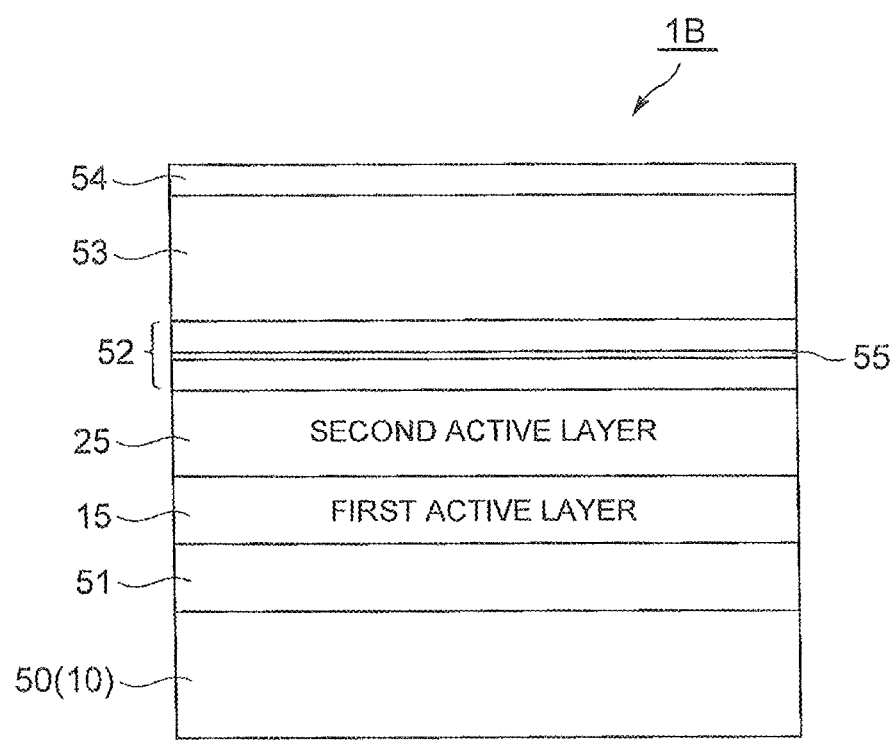
FIG. 4 is a drawing showing an example of the configuration of the quantum cascade laser.
Figure 5:
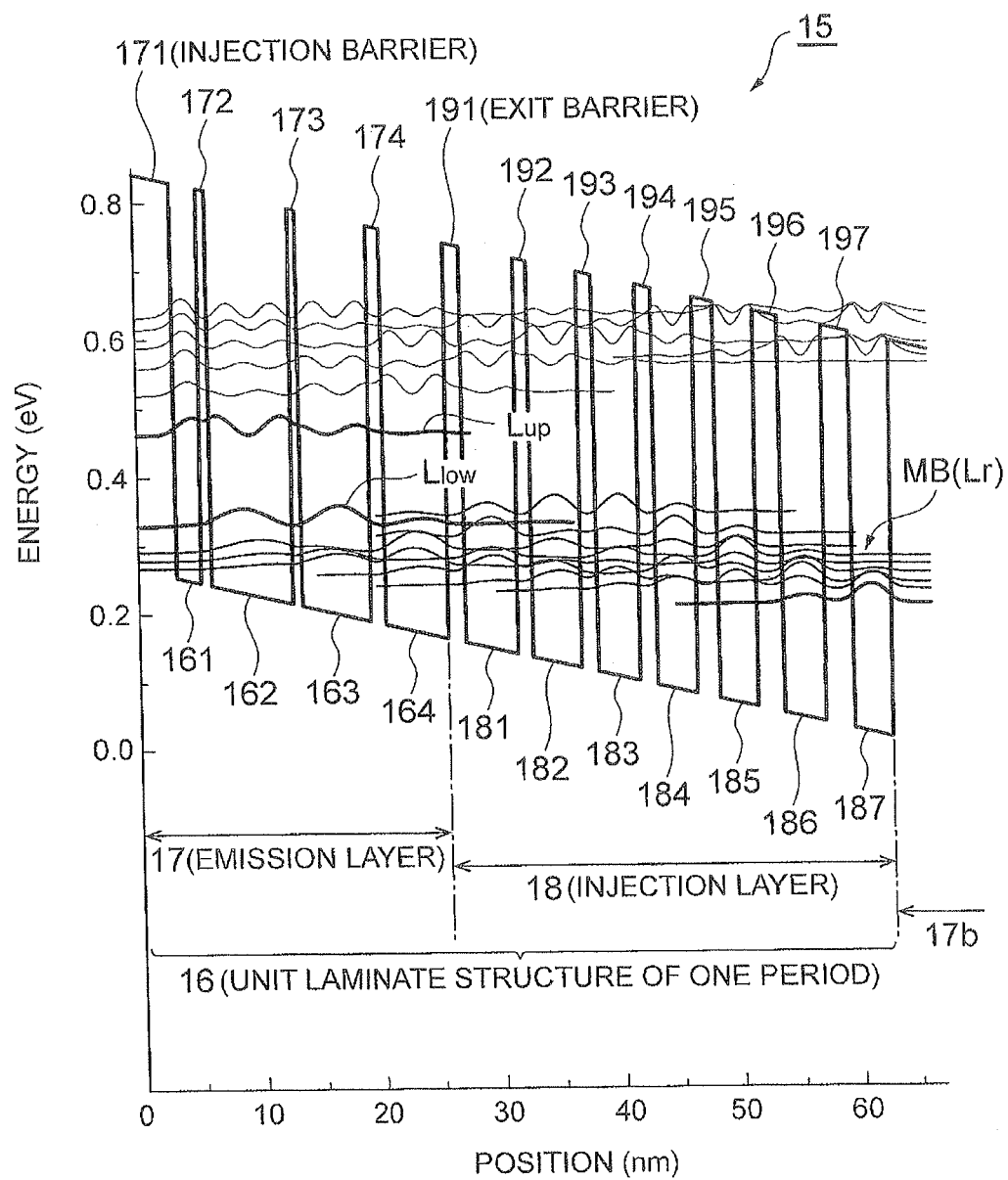
FIG. 5 is a drawing showing an example of a configuration of a unit laminate structure forming the first active layer.
Figure 7:
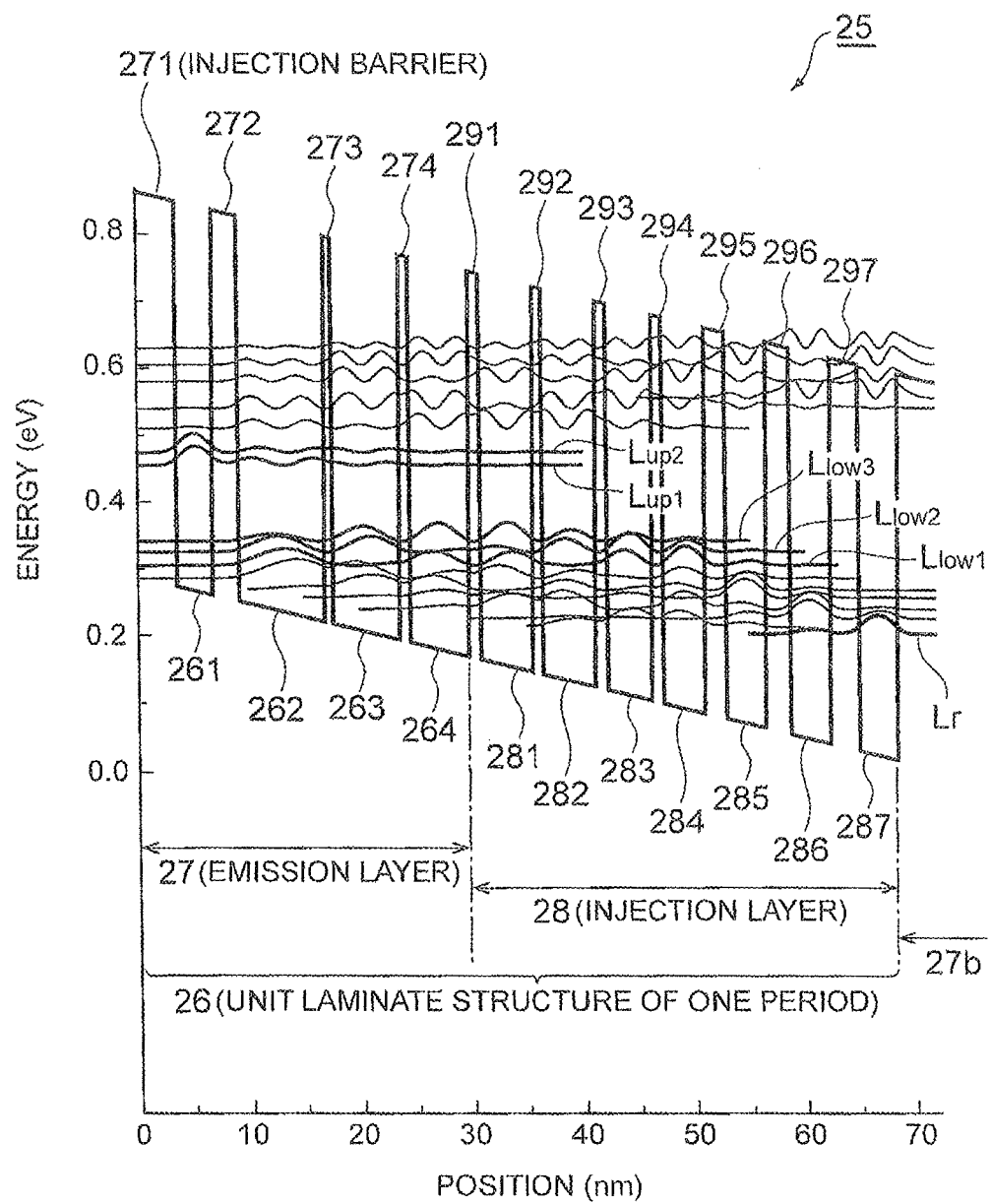
FIG. 7 is a drawing showing an example of a configuration of a unit laminate structure forming the second active layer.

The configuration of the quantum cascade laser according to the present invention will be further described along with a specific example of the device structure including the quantum well structures in the first and second active layers. FIG. 4 is a drawing showing an example of the specific configuration of the quantum cascade laser. FIG. 5 is a drawing showing an example of the configuration of the first unit laminate structure constituting the first active layer in the quantum cascade laser shown in FIG. 4, and FIG. 6 is a table showing an example of the structure of the first unit laminate structure of one period in the first active layer. FIG. 7 is a drawing showing an example of the configuration of the second unit laminate structure constituting the second active layer in the quantum cascade laser shown in FIG. 4, and FIG. 8 is a table showing an example of the structure of the second unit laminate structure of one period in the second active layer.

It is noted herein that FIG. 5 shows the quantum well structure and subband level structure of a part of the multistage repetitive structure of the emission layer 17 and the injection layer 18 in the first active layer 15. It is also noted that FIG. 7 similarly shows the quantum well structure and subband level structure of a part of the multistage repetitive structure of the emission layer 27 and the injection layer 28 in the second active layer 25. The device structure shown in FIG. 4 to FIG. 8 can be formed by crystal growth, e.g., by the molecular beam epitaxy (MBE) method or by the metal organic vapor phase epitaxy (MOVPE) method.

The semiconductor laminate structure of the quantum cascade laser (DFG-THz-QCL) 1B shown in FIG. 4 uses a semi-insulating InP single crystal substrate 50 as the semiconductor substrate 10. The crystal growth can be implemented as growth with consistency, for example, by the MOVPE method. Successively deposited on this InP substrate 50 in order from the substrate side are an InGaAs lower core layer 51 with the thickness of 300 nm, the first active layer 15 consisting of the multistage stack of the first unit laminate structures 16, the second active layer 25 consisting of the multistage stack of the second unit laminate structures 26, an InGaAs upper core layer 52 with the thickness of 300 nm, an InP cladding layer 53 with the thickness of 5 μm, and an InGaAs contact layer (n=5×10$^{16}$ cm$^{-3}$) 54 with the thickness of 1.5 μm, whereby the device structure of the quantum cascade laser 1B is formed as DFG-THz-QCL. Furthermore, a diffraction grating structure 55 being a wavelength selection mechanism is formed at a predetermined position in the upper core layer 52. In this laminate structure, the core layers, cladding layer, and contact layer except for the active layers are lattice-matched with the InP substrate.

Figure 12:
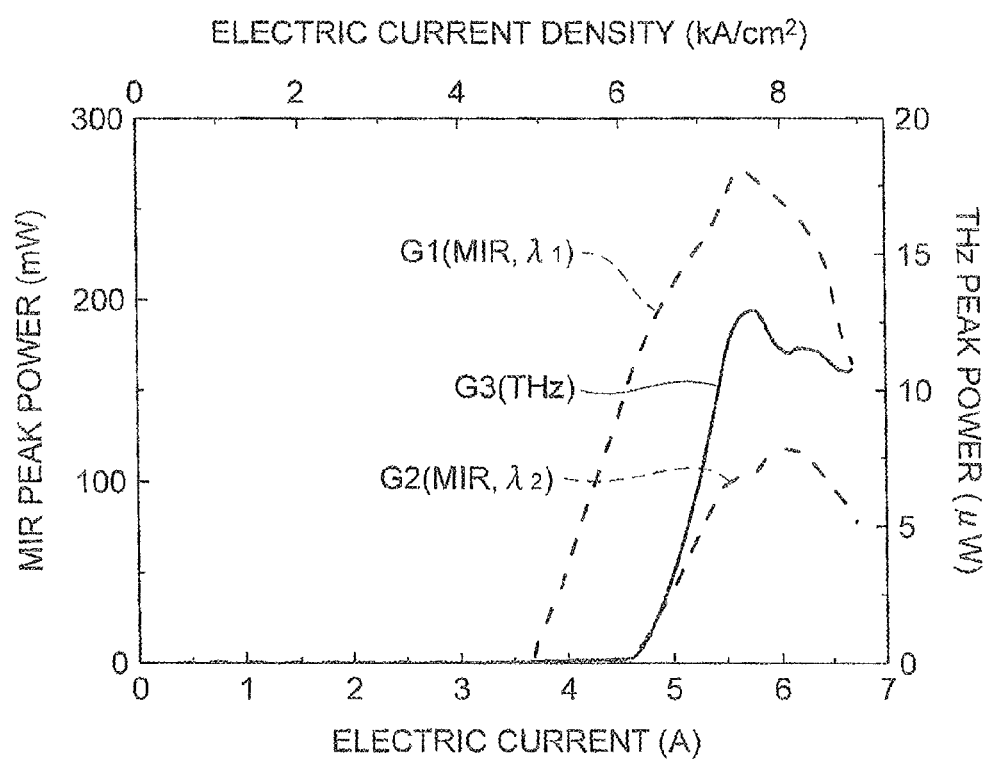
FIG. 12 is a graph showing electric current—light output characteristics of the quantum cascade laser.

For a specific structure of the laser device, the process to the ridge waveguide (cf. FIG. 11 in Patent Literature 1) is carried out after completion of the crystal growth of the laminate structure shown in FIG. 4, thereby enabling the light emission by DFG to be suitably achieved. At this time, when the taper structure is formed as shown in FIG. 12 of Patent Literature 1, the DFG emission can be extracted with high efficiency. Further, it was recently reported that the emission could be extracted with drastically high efficiency when the substrate on the exit end face side was polished to the Cerenkov angle (about 20° in the case of the InP substrate) (Non Patent Literature 7: Appl. Phys. Lett. Vol. 100 (2012) pp. 251104-1-251104-4), and it is also preferred to apply this technique to the above laminate structure.

In designing the first and second active layers 15, 25 in the quantum cascade laser 1B, the designed frequencies $\omega$, $\omega_1$, and $\omega_2$ are first determined. Since the frequency $\omega$ of the THz light to be obtained finally by the difference frequency generation is in the relation of $\omega=\omega_1-\omega_2$ with the first and second frequencies $\omega_1$ and $\omega_2$ of the pump light components, the selection of the frequencies (wavelengths) herein is very important.

The cascade structure of the first active layer 15 to be used in this configuration example for generating the light of the first frequency $\omega_1$ is the SPC structure shown in FIG. 2. The SPC structure is not always a structure suitable for the DFG because it cannot obtain the large nonlinear susceptibility $\chi^{(2)}$ for the reason of the structural feature of the emission transition from one upper level to one lower level, but the use of the SPC structure facilitates high-performance oscillation at high temperature not less than room temperature; therefore, it is extremely suitable as the structure for generation of the pump light of the first frequency $\omega_1$. In addition, when the foregoing DAU/MS structure is used as the cascade structure of the second active layer 25 of the multistage lamination, it becomes feasible to generate the light of the second frequency $\omega_2$ and to suitably generate the THz light of the difference frequency $\omega$ by DFG, while making use of the large second order nonlinear susceptibility $\chi^{(2)}$.

FIG. 5 and FIG. 6 show an example of the configuration of the unit laminate structures 16 in the first active layer 15 to be used for generation of the light of the first frequency $\omega_1$. The quantum well structure of the active layer 15 in the present configuration example shows the example based on such design that the oscillation wavelength corresponding to the first frequency $\omega_1$ is the first wavelength $\chi_1=9.0$ μm of mid-infrared (MIR) light and that the oscillation energy is $E_1=138$ meV. The active layer 15 is configured in the lamination structure in which the first unit laminate structures 16 each of which includes the emission layer 17 and the injection layer 18 are laminated by 20 periods.

The unit laminate structure 16 of one period, as shown in FIG. 5, is configured as a quantum well structure in which eleven quantum well layers 161-164, 181-187 and eleven quantum barrier layers 171-174, 191-197 are alternately laminated. Among these semiconductor layers of the unit laminate structure 16, the quantum well layers are formed of $In_{0.56}Ga_{0.44}As$ layers. Furthermore, the quantum barrier layers are formed of $In_{0.48}Al_{0.52}As$ layers.

In the unit laminate structure 16 of this configuration, concerning the emission layer 17 and the injection layer 18, the laminate part consisting of the four well layers 161-164 and barrier layers 171-174 in the laminate structure shown in FIG. 5 serves as a portion to function mainly as the emission layer 17. Furthermore, the laminate part consisting of the seven well layers 181-187 and barrier layers 191-197 serves as a portion to function mainly as the injection layer 18.

The first-stage quantum barrier layer 171, out of the semiconductor layers of the emission layer 17, is located between the injection layer of the preceding stage and the emission layer 17 and serves as an injection barrier layer for electrons from the injection layer of the preceding stage to the emission layer 17. Similarly, the first-stage quantum barrier layer 191, out of the semiconductor layers of the injection layer 18, is located between the emission layer 17 and the injection layer 18 and serves as an exit barrier layer for electrons from the emission layer 17 to the injection layer 18. FIG. 6 shows an example of the specific structure of the first unit laminate structure 16 of one period in the first active layer 15.

In this configuration, the first unit laminate structure 16 has the subband level structure shown in FIG. 5, which has the emission upper level $L_{up}$, the emission lower level $L_{low}$, and the miniband MB including the plurality of levels functioning as the relaxation level $L_r$, and is configured so as to be able to generate the light of the first frequency $\omega_1$. The layer thicknesses of the respective quantum well layers and barrier layers in the emission layer 17 and the injection layer 18 are designed based on the quantum mechanics.

FIG. 7 and FIG. 8 show an example of the configuration of the unit laminate structure 26 in the second active layer 25 to be used for generation of the light of the second frequency $\omega_2$ and for generation of the light of the difference frequency $\omega$ by DFG. The quantum well structure of the active layer 25 in the present configuration example shows the example based on such design that the oscillation wavelength corresponding to the second frequency $\omega_2$ is the second wavelength $\chi_2=10.5$ μm of mid-infrared (MIR) light and the oscillation energy is $E_2=118$ meV. The active layer 25 is configured in the laminate structure in which the second unit laminate structures 26 each of which includes the emission layer 27 and the injection layer 28 are laminated by 30 periods.

The unit laminate structure 26 of one period, as shown in FIG. 7, is configured as a quantum well structure in which eleven quantum well layers 261-264, 281-187 and eleven quantum barrier layers 271-274, 291-297 are alternately laminated. Among these semiconductor layers of the unit laminate structure 26, the quantum well layers are formed of $In_{0.56}Ga_{0.44}As$ layers. Furthermore, the quantum barrier layers are formed of $In_{0.48}Al_{0.52}As$ layers.

In the unit laminate structure 26 of this configuration, concerning the emission layer 27 and the injection layer 28, the laminate part consisting of the four well layers 261-264 and barrier layers 271-274 in the laminate structure shown in FIG. 7 serves as a portion to function mainly as the emission layer 27. Furthermore, the laminate part consisting of the seven well layers 281-287 and barrier layers 291-297 serves as a portion to function mainly as the injection layer 28. The first-stage quantum barrier layer 271, out of the semiconductor layers of the emission layer 27, is located between the injection layer of the preceding stage and the emission layer 27 and serves as an injection barrier layer for electrons from the injection layer of the preceding stage to the emission layer 27.

In the present configuration example, there is no barrier layer functioning effectively as an exit barrier, as to the exit barrier layer for electrons from the emission layer 27 to the injection layer 28, which is to be located between the emission layer 27 and the injection layer 28. In FIG. 7, the barrier layer 291 is defined formally as an exit barrier layer, and on the front and back sides thereof, the emission layer 27 and the injection layer 28 are functionally separated. FIG.

8 shows an example of the specific structure of the second unit laminate structure 26 of one period in the second active layer 25.

In this configuration, the second unit laminate structure 26 has the subband level structure shown in FIG. 7, which has the first and second emission upper levels $L_{up1}$ ($L_4$), $L_{up2}$ ($L_5$), the first, second, and third emission lower levels $L_{low1}$ ($L_1$), $L_{low2}$ ($L_2$), and $L_{low3}$ ($L_3$), and one or more relaxation levels $L_r$, and is configured so as to be able to generate each of the light of the first and second frequencies $\omega_1$ and $\omega_2$. The layer thicknesses of the respective quantum well layers and barrier layers in the emission layer 27 and the injection layer 28 are designed based on the quantum mechanics.

In designing the quantum well structure and the subband level structure of this unit laminate structure 26, it is necessary to finely adjust the thicknesses of the respective quantum well layers and barrier layers so as to satisfy the conditions of the level distances of $\Delta E_{41}=\Delta E_{52}=E_1$ and $\Delta E_{42}=\Delta E_{53}=E_2$ described above with FIG. 3. When the dipole moment of the emission transition of levels $L_n \rightarrow L_m$ is defined as $z_{nm}$, the dipole moments corresponding to transition intensities of the respective emission transitions in the present configuration example are $z_{54}=4.66$ nm, $z_{53}=1.63$ nm, $z_{52}=1.33$ nm, $z_{51}=0.62$ nm, $z_{43}=1.4$ nm, $Z_{42}=1.36$ nm, $Z_{41}=0.735$ nm, $z_{32}=8.848$ nm, $z_{31}=0.7$ nm, and $z_{21}=9.99$ nm.

Figure 9:
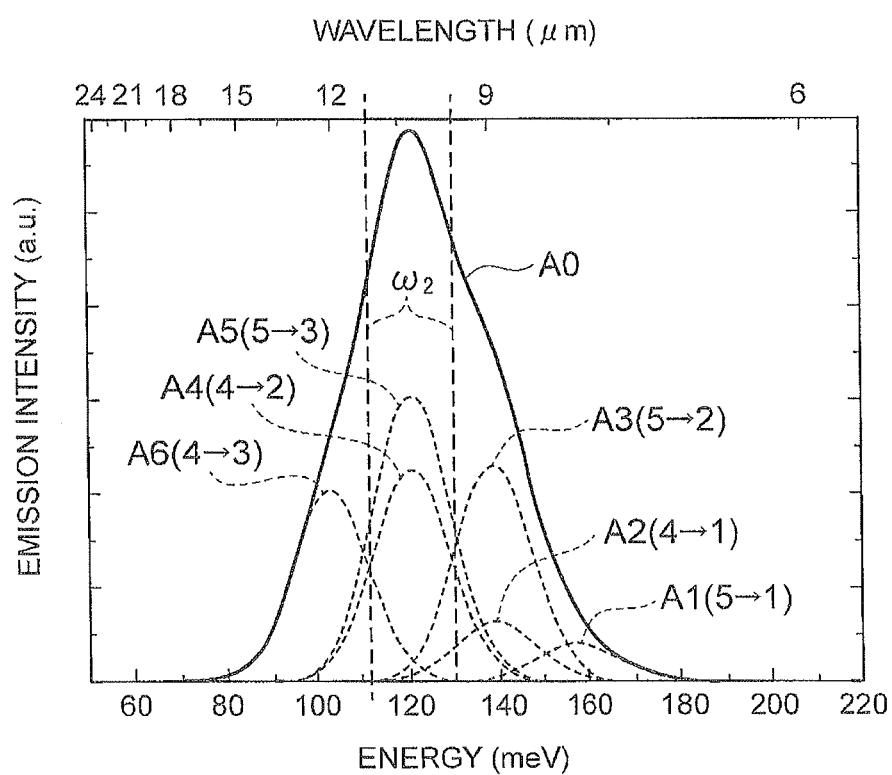
FIG. 9 is a graph showing emission spectra obtained in the second active layer.

The second unit laminate structure 26 shown in FIG. 7 is designed so as to induce the transitions at both of the frequencies $\omega_1$ and $\omega_2$, and the light emission in the second active layer 25 is superposition of various emission components. FIG. 9 is a graph showing emission spectra obtained in the second active layer. In the graph of FIG. 9 herein, the horizontal axis represents the emission energy (meV) or the wavelength (μm) and the vertical axis the emission intensity (a.u.).

In FIG. 9, graph A1 indicates the emission spectrum of the transition 5→1, graph A2 the emission spectrum of the transition 4→1, graph A3 the emission spectrum of the transition 5→2, graph A4 the emission spectrum of the transition 4→2, graph A5 the emission spectrum of the transition 5→3, and graph A6 the emission spectrum of the transition 4→3. Among these transitions, the transitions 4→1 and 5→2 correspond to the first frequency $\omega_1$ and the transitions 4→2 and 5→3 to the second frequency $\omega_2$. Furthermore, graph A0 indicates the overall emission spectrum as the sum of the emission intensities in the respective transitions indicated by the graphs A1 to A6.

As shown in the graph of the emission spectra of FIG. 9, the emission from the second active layer 25 having the DAU/MS structure has the very wide emission spectrum and the emission frequency as a whole is an intermediate frequency of the first and second frequencies $\omega_1$ and $\omega_2$. On the other hand, since in the configuration example shown in FIG. 4 to FIG. 8 the light of the first frequency $\omega_1$ is supplied from the first active layer 15, the light of the second frequency $\omega_2$ is preferably selectively oscillated as the light generated in the second active layer 25. For this reason, the configuration example shown in FIG. 4 has the diffraction grating structure 55 for forcibly selecting and oscillating the light of the second frequency $\omega_2$, as a feedback mechanism for selecting the wavelength of oscillating light in the second active layer 25, in the upper core layer 52, thereby constituting the distributed feedback (DFB) type oscillation mechanism.

The diffraction grating structure 55 to be used for selecting the light of the second frequency $\omega_2$ can be, for example, a configuration in which a diffraction grating with the depth of 100 nm and the pitch of 1650 nm is formed inside a waveguide. In this configuration example, the second frequency $\omega_2$ selected by the diffraction grating structure 55, together with the first frequency $\omega_1$, determines the frequency $\omega$ of the THz light generated by the DFG and thus the setting of the pitch and the selected frequency in the diffraction grating structure 55 is important. The energy of the light selected by the diffraction grating structure 55 is preferably set in the range of about ±5% of the energy $\Delta E_{42}$ of the transition 4→2. This is determined with consideration to the fact that the half width of electroluminescence of a single intersubband transition at room temperature is approximately ten and several % of a center wavelength.

Figure 10:
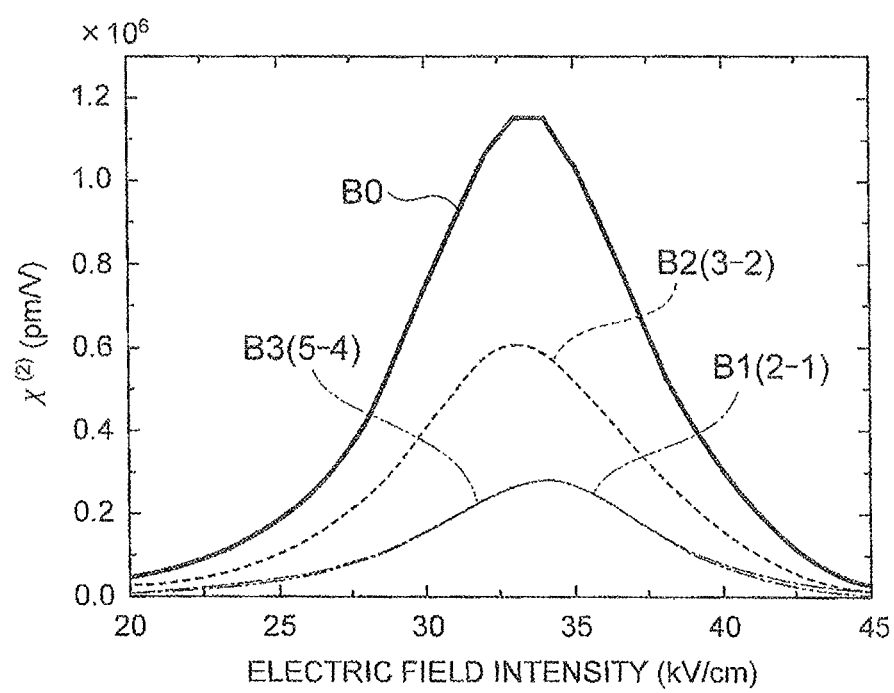
FIG. 10 is a graph showing electric field intensity dependence of the second order nonlinear susceptibility.

The second active layer 25, as described above, has the function of generating the THz wave by the difference frequency generation making use of the high second order nonlinear susceptibility $\chi^{(2)}$, in addition to the supply of the light of the second frequency $\omega_2$. FIG. 10 is a graph showing electric field intensity dependence of the second order nonlinear susceptibility $\chi^{(2)}$ in the second active layer 25. In the graph of FIG. 10, the horizontal axis represents the electric field intensity (kV/cm) and the vertical axis the second order nonlinear susceptibility $\chi^{(2)}$ (pm/V). In FIG. 10, graph B1 indicates the nonlinear susceptibility by the levels 2-1, graph B2 the nonlinear susceptibility by the levels 3-2, and graph B3 the nonlinear susceptibility by the levels 5-4. Furthermore, graph B0 indicates the overall nonlinear susceptibility as the sum of the susceptibilities by the respective levels indicated by the graphs B1 to B3.

As shown in the graph of the nonlinear susceptibility $\chi^{(2)}$ of FIG. 10, the foregoing configuration example obtains the large susceptibility $\chi^{(2)}$ in each level distance, near the operating electric field, and thus the active layer 25 is found to effectively function. Furthermore, the high susceptibility of $\chi^{(2)}=1.15\times10^6$ pm/V is obtained as a total of the three level distance components of the levels 5-4, 3-2, and 2-1. This indicates a sufficiently higher value than the value of $\chi^{(2)}=6.5\times10^5$ pm/V in the case of BTC (bound-to-continuum) type DFG-QCL of the conventional structure as calculated under the similar condition.

The diffraction grating structure 55 (cf. FIG. 4) provided for the second active layer 25, for selecting the light of the second frequency $\omega_2$, is preferably made to act only on the light oscillated by the second active layer 25 out of the first and second active layers 15, 25, by adjusting the value of coupling coefficient κ for light fed back by the diffraction grating. However, since spectral hole burning occurs in the configuration using the plurality of cascade active layer structures as shown in FIG. 4, the oscillation of the light of the first frequency $\omega_1$ off the feedback by the diffraction grating is not affected by the diffraction grating and, therefore, the above-described condition is readily achieved.

On the other hand, concerning the value of the second frequency the nonlinear susceptibility $\chi^{(2)}$ obtained is significantly affected by the frequency, and thus the range available for the value is limited. FIG. 11 includes graphs showing dependence of the second order nonlinear susceptibility $\chi^{(2)}$ on the energy of the light of the second frequency $\omega_2$ in the second active layer 25. In the graph of (a) in FIG. 11, the horizontal axis represents the energy $E_2$ (eV) of the light of the second frequency $\omega_2$, and the vertical axis the second order nonlinear susceptibility $\chi^{(2)}$ (pm/V). In the graph of (b) in FIG. 11, the horizontal axis represents the difference $E_1-E_2$ (meV) between the energy of the light of the first frequency $\omega_1$ and the energy of the light of the second frequency $\omega_2$, and the vertical axis the second order nonlinear susceptibility $\omega^{(2)}$ (pm/V).

In (a) and (b) in FIG. 11, graphs C1, D1 indicate the nonlinear susceptibilities by the levels 2-1, graphs C2, D2 the nonlinear susceptibilities by the levels 3-2, and graphs C3, D3 the nonlinear susceptibilities by the levels 5-4. Furthermore, graphs C0, D0 indicate the overall nonlinear susceptibilities as the sums of the susceptibilities by the respective levels indicated by graphs C1 to C3, D1 to D3. It is assumed herein that the energy of the light of the first frequency $\omega_1$ is fixed at $E_1$=138 meV. As shown in these graphs, it is understood that, with variation in the energy $E_2$ of the light of the second frequency $\omega_2$, the value of the susceptibility $\chi^{(2)}$ significantly decreases with distance from a peak.

The configuration shown in FIG. 4, as an example, shows the configuration in which the light of the second frequency $\omega_2$ is selected by the diffraction grating structure 55, but it is also possible to adopt a configuration, for example, in which two types of diffraction grating structures are formed, so as to implement the DFB operation for both of the light of the first and second frequencies $\omega_1$ and $\omega_2$. This configuration can be realized, for example, by setting the pitches of the diffraction gratings to 1410 nm and to 1650 nm, respectively, for the first and second frequencies $\omega_1$ and $\omega_2$.

The below will describe, with use of FIG. 12 and FIG. 13, the device characteristics at room temperature of the quantum cascade laser which is configured as a laser device with the cavity length of 3 mm and the ridge width of 25 μm processed in the ridge waveguide structure, in the above-described specific configuration example.

FIG. 12 is a graph showing electric current-light output characteristics for the mid-infrared (MIR) light and terahertz (THz) light of the quantum cascade laser. In this graph, the horizontal axis represents the electric current (A) or electric current density (kA/cm$^2$) and the vertical axis the peak power (mW) of the MIR light or the peak power (μW) of the THz light. The device characteristics shown herein are, specifically, those obtained when the laser device was made to operate in pulse operation at the temperature T=297K, pulse width of 100 ns, and repetition frequency of 30 kHz.

In FIG. 12, graph G1 indicates the electric current dependence of the peak power of the MIR light of the first wavelength $\lambda_1$ and graph G2 the electric current dependence of the peak power of the MIR light of the second wavelength $\lambda_2$. Furthermore, graph G3 indicates the electric current dependence of the peak power of the THz light generated by the difference frequency generation. As shown in these graphs, the threshold current densities of 4.7 kA/cm$^2$ and 6 kA/cm$^2$ were confirmed respectively for the MIR light components of the first and second wavelengths $\lambda_1$ and $\lambda_2$. As for the output of the THz light, the peak power of about 13 μW was obtained.

Figure 13:
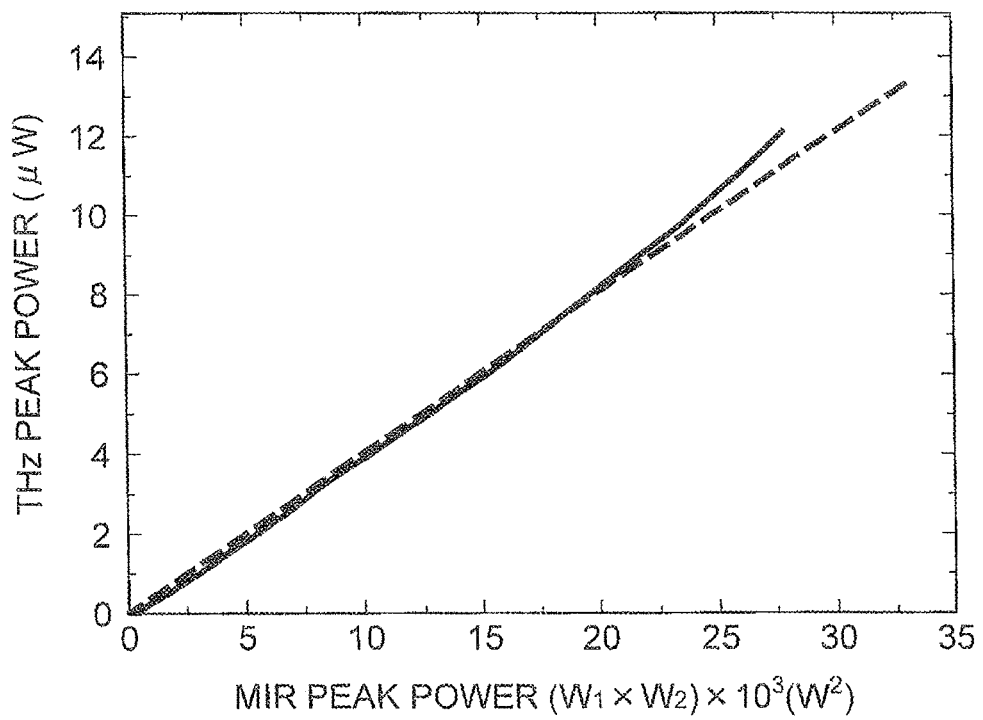
FIG. 13 is a graph showing a relationship between two-wavelength mid-infrared light outputs and terahertz light output.

FIG. 13 is a graph showing a relationship between the mid-infrared (MIR) light outputs of the two wavelengths and the terahertz (THz) light output. In this graph, the horizontal axis represents the quantity $(W_1 \times W_2) \times 10^3$ (W$^2$) for the peak powers of the MIR light components of the two wavelengths $\lambda_1$ and $\lambda_2$, and the vertical axis the peak power (μW) of the THz light. In the data shown in FIG. 13, the THz conversion efficiency is obtained as $\eta$=0.41 mW/W$^2$. This, while indicating the multimode, is the value approximately equivalent to the highest of the efficiencies that have been reported heretofore. In FIG. 13, a graph of a solid line indicates the values calculated from the respective outputs and a graph of a dashed line a straight line of $\eta$=0.41 mW/W$^2$ being the conversion efficiency (slope).

The quantum cascade laser according to the present invention does not have to be limited to the above-described embodiment and configuration example, but can be modified in many ways. For example, in the foregoing configuration example, the InP substrate is used as the semiconductor substrate and the first and second active layers are made of InGaAs/InAlAs as an example, but a variety of specific configurations may be adopted as long as they can implement the emission transitions by the intersubband transitions in the quantum well structure and can realize the above-described subband level structures.

As for the semiconductor material systems, it is possible to use a variety of material systems, e.g., such as GaAs/AlGaAs, InAs/AlSb, GaN/AlGaN, and SiGe/Si, besides aforementioned InGaAs/InAlAs. Various methods may also be used as crystal growth methods of semiconductors.

The above-described configuration example shows the case where the first and second active layers are configured in the strain-compensated structure, but these active layers may be configured using a structure in which they are lattice-matched with the InP substrate, Regarding the laminate structures in the active layers of the quantum cascade laser and the semiconductor laminate structure as the entire laser device, various structures may be used besides the above-described structures. In general, a quantum cascade laser only needs to be configured with the semiconductor substrate and the first and second active layers of the foregoing configurations provided on the semiconductor substrate. The unit laminate structure of the first active layer only needs to have the subband level structure having the emission upper level and the emission lower level and be configured so as to be able to generate the light of the first frequency $\omega_1$ by the intersubband emission transition of electrons, and the unit laminate structure of the second active layer only needs to have the subband level structure having the first emission upper level, the second emission upper level, and the plurality of emission lower levels and be configured so as to be able to generate at least the light of the second frequency $\omega_2$ by the intersubband emission transitions of electrons.

The quantum cascade laser according to the foregoing embodiment comprises (1) the semiconductor substrate; (2) the first active layer provided on the semiconductor substrate and having the cascade structure in which the quantum well emission layers and injection layers are alternately stacked in the form of the multistage lamination of the first unit laminate structures each of which comprises the quantum well emission layer and the injection layer; and (3) the second active layer provided in series to the first active layer on the semiconductor substrate and having the cascade structure in which the quantum well emission layers and injection layers are alternately stacked in the form of the multistage lamination of the second unit laminate structures each of which comprises the quantum well emission layer and the injection layer, and uses the configuration in which (4) the first unit laminate structure of the first active layer has the subband level structure having the emission upper level and the emission lower level, and is configured so as to be able to generate the light of the first frequency $\omega_1$ by the intersubband emission transition of electrons, (5) the second unit laminate structure of the second active layer has the subband level structure having the first emission upper level, the second emission upper level of the higher energy than the first emission upper level, and the plurality of emission lower levels, and is configured so as to be able to generate at least the light of the second frequency $\omega_2$ by the intersubband emission transitions of electrons, and (6) the light of the difference frequency $\omega$ between the first frequency $\omega_1$ and the second frequency $\omega_2$ is generated by the difference frequency generation by the light of the first frequency $\omega_1$ generated in the first active layer and the light of the second frequency $\omega_2$ generated in the second active layer.

In the above configuration, the second unit laminate structure of the second active layer is preferably configured so as to be able to generate the light of the first frequency $\omega_1$, in addition to the light of the second frequency $\omega_2$, in its subband level structure. This configuration can fully increase the second order nonlinear susceptibility $\chi^{(2)}$ for the difference frequency generation by the light of the first frequency $\omega_1$ and the light of the second frequency $\omega_2$, thereby generating the light of the difference frequency $\omega$ with high efficiency.

In the above configuration, the laser is preferably provided with the distributed feedback type oscillation mechanism by the diffraction grating for selecting the light of the second frequency $\omega_2$, for the light generated in the second active layer. When the cavity structure of the quantum cascade laser is provided with such a distributed feedback (DFB) type oscillation mechanism, the light of the second frequency $\omega_2$ to be used for the generation of the light of the difference frequency $\omega$ can be suitably selectively generated in the second active layer.

The level structure associated with the emission of light in the second active layer may be specifically configured as follows: the second unit laminate structure of the second active layer has the subband level structure including the first emission lower level, the second emission lower level of the higher energy than the first emission lower level, and the third emission lower level of the higher energy than the second emission lower level as the plurality of emission lower levels.

In this case, the second unit laminate structure of the second active layer is preferably configured so that each of the energy difference between the first emission lower level and the second emission lower level, the energy difference between the second emission lower level and the third emission lower level, and the energy difference between the first emission upper level and the second emission upper level is substantially equal to the energy of the light of the difference frequency $\omega$. The configuration to make the energy differences of the three level distances approximately equal, allows the second order nonlinear susceptibility $\chi^{(2)}$ for generating the light of the difference frequency $\omega$ by the difference frequency generation to be set to a sufficiently large value.

In this case, concerning the energies of the emission transitions, the second unit laminate structure of the second active layer is preferably configured with the subband level structure such that each of the energy of the emission transition from the first emission upper level to the first emission lower level and the energy of the emission transition from the second emission upper level to the second emission lower level is substantially equal to the energy of the light of one of the first frequency $\omega_1$ and the second frequency $\omega_2$, and such that each of the energy of the emission transition from the first emission upper level to the second emission lower level and the energy of the emission transition from the second emission upper level to the third emission lower level is substantially equal to the energy of the light of the other of the first frequency $\omega_1$ and the second frequency $\omega_2$.

In the above configuration, the level structure in the first active layer can be configured as follows: the first unit laminate structure of the first active layer has the subband level structure having the relaxation miniband including the plurality of levels of the lower energies than the emission lower level, and the electrons through the emission transition from the emission upper level to the emission lower level are relaxed from the emission lower level to the relaxation miniband by the longitudinal optical phonon scattering. The SPC (single phonon resonance-continuum) structure of this configuration can suitably generate the light of the first frequency $\omega_1$ with high efficiency.

INDUSTRIAL APPLICABILITY

The present invention is applicable as the quantum cascade lasers capable of suitably generating the long-wavelength light such as the terahertz light.

REFERENCE SIGNS LIST 1A, 1B—quantum cascade laser, 10—semiconductor substrate, 15—first active layer, 16—first unit laminate structure, 17—quantum well emission layer, 18—injection layer, 25—second active layer, 26—second unit laminate structure, 27—quantum well emission layer, 28—injection layer, 50—InP substrate, 51—InGaAs lower core layer, 52—InGaAs upper core layer, 53—InP cladding layer, 54—InGaAs contact layer, 55—diffraction grating structure, $L_{up}$—emission upper level, $L_{up1}$—first emission upper level, $L_{up2}$—second emission upper level, $L_{low}$—emission lower level, $L_{low1}$—first emission lower level, $L_{low2}$—second emission lower level, $L_{low3}$—third emission lower level, $L_r$—relaxation level, MB—relaxation miniband.

The invention claimed is:

1. A quantum cascade laser comprising:
a semiconductor substrate;
a first active layer provided on the semiconductor substrate and having a cascade structure in which quantum well emission layers and injection layers are alternately stacked in the form of a multistage lamination of first unit laminate structures each of which comprises the quantum well emission layer and the injection layer; and
a second active layer provided in series to the first active layer on the semiconductor substrate and having a cascade structure in which quantum well emission layers and injection layers are alternately stacked in the form of a multistage lamination of second unit laminate structures each of which comprises the quantum well emission layer and the injection layer, wherein
the first unit laminate structure of the first active layer has a subband level structure having an emission upper level and an emission lower level, and is configured so as to be able to generate light of a first frequency $\omega_1$ by intersubband emission transition of electrons,
the second unit laminate structure of the second active layer has a subband level structure having a first emission upper level, a second emission upper level of a higher energy than the first emission upper level, and a plurality of emission lower levels, and is configured so as to be able to generate at least light of a second frequency $\omega_2$ by intersubband emission transitions of electrons, and
light of a difference frequency $\omega$ between the first frequency $\omega_1$ and the second frequency $\omega_2$ is generated by difference frequency generation from the light of the first frequency $\omega_1$ generated in the first active layer and the light of the second frequency $\omega_2$ generated in the second active layer, and wherein
the second unit laminate structure of the second active layer is configured so as to be able to generate the light of the first frequency $\omega_1$, in addition to the light of the second frequency $\omega_2$, in the subband level structure thereof, and the quantum cascade laser being provided with a distributed feedback type oscillation mechanism by a diffraction grating for selecting the light of the second frequency $\omega_2$, for the light generated in the second active layer.

2. The quantum cascade laser according to claim 1, wherein the first unit laminate structure of the first active layer has the subband level structure having a relaxation miniband including a plurality of levels of lower energies than the emission lower level, and the electrons through the emission transition from the emission upper level to the emission lower level are relaxed from the emission lower level to the relaxation miniband by longitudinal optical phonon scattering.

3. A quantum cascade laser comprising:

a semiconductor substrate;

a first active layer provided on the semiconductor substrate and having a cascade structure in which quantum well emission layers and injection layers are alternately stacked in the form of a multistage lamination of first unit laminate structures each of which comprises the quantum well emission layer and the injection layer; and a second active layer provided in series to the first active layer on the semiconductor substrate and having a cascade structure in which quantum well emission layers and injection layers are alternately stacked in the form of a multistage lamination of second unit laminate structures each of which comprises the quantum well emission layer and the injection layer, wherein the first unit laminate structure of the first active layer has a subband level structure having an emission upper level and an emission lower level, and is configured so as to be able to generate light of a first frequency $\omega_1$ by intersubband emission transition of electrons, the second unit laminate structure of the second active layer has a subband level structure having a first emission upper level, a second emission upper level of a higher energy than the first emission upper level, and a plurality of emission lower levels, and is configured so as to be able to generate at least light of a second frequency $\omega_2$ by intersubband emission transitions of electrons, and light of a difference frequency $\omega$ between the first frequency $\omega_1$ and the second frequency $\omega_2$ is generated by difference frequency generation from the light of the first frequency $\omega_1$ generated in the first active layer and the light of the second frequency $\omega_2$ generated in the second active layer, and wherein the second unit laminate structure of the second active layer has the subband level structure having a first emission lower level, a second emission lower level of a higher energy than the first emission lower level, and a third emission lower level of a higher energy than the second emission lower level as the plurality of emission lower levels, and is configured so that each of an energy difference between the first emission lower level and the second emission lower level, an energy difference between the second emission lower level and the third emission lower level, and an energy difference between the first emission upper level and the second emission upper level is substantially equal to an energy of the light of the difference frequency $\omega$.

4. The quantum cascade laser according to claim 3, wherein the second unit laminate structure of the second active layer is configured with the subband level structure such that each of an energy of the emission transition from the first emission upper level to the first emission lower level and an energy of the emission transition from the second emission upper level to the second emission lower level is substantially equal to an energy of the light of one of the first frequency $\omega_1$ and the second frequency $\omega_2$, and each of an energy of the emission transition from the first emission upper level to the second emission lower level and an energy of the emission transition from the second emission upper level to the third emission lower level is substantially equal to an energy of the light of the other of the first frequency $\omega_1$ and the second frequency $\omega_2$.

5. The quantum cascade laser according to claim 3, wherein the first unit laminate structure of the first active layer has the subband level structure having a relaxation miniband including a plurality of levels of lower energies than the emission lower level, and the electrons through the emission transition from the emission upper level to the emission lower level are relaxed from the emission lower level to the relaxation miniband by longitudinal optical phonon scattering.

* * * * *